United States Patent [19]

Harigane et al.

[11] 4,166,312
[45] Sep. 4, 1979

[54] APPARATUS FOR RE-FORMING AN AXIAL LEAD OF AN ELECTRONIC COMPONENT INTO U-SHAPE AND AFFIXING SAID COMPONENT TO ELONGATED SUPPORT TAPE

[75] Inventors: Kotaro Harigane; Akihiro Kato; Kenji Fujita, all of Tokyo, Japan

[73] Assignee: Tokyo Denki Kagaku Kogyo Kabushiki Kaisha, Tokyo, Japan

[21] Appl. No.: 833,945

[22] Filed: Sep. 16, 1977

[30] Foreign Application Priority Data

Sep. 17, 1976 [JP] Japan .................................. 51/110707
Jun. 7, 1977 [JP] Japan ............................. 52/73267[U]

[51] Int. Cl.² ......................... B23P 23/04; B21D 1/00; B21D 1/04
[52] U.S. Cl. .................................... 29/38 C; 29/566.1; 29/564.1; 29/564.8; 83/214; 140/1; 140/105
[58] Field of Search ................. 29/566.1, 566.3, 564.8, 29/563, 33 M, 33 K, 38 C, 564.1; 140/105, 1; 53/3, 23, 21 FW, 198 R, 200, 180 R, 116, 123, 196, 389; 83/214

[56] References Cited

U.S. PATENT DOCUMENTS

| | | | |
|---|---|---|---|
| 2,696,848 | 12/1954 | McCoy | 140/1 |
| 3,004,262 | 10/1961 | Cubbidge et al. | 29/566.3 X |
| 3,177,629 | 4/1965 | Anspach | 53/198 R |
| 3,215,168 | 11/1965 | Dian et al. | 140/105 X |
| 3,421,284 | 1/1969 | Zemek | 53/200 X |
| 3,540,494 | 11/1970 | Susong | 140/105 X |
| 3,900,053 | 8/1975 | Weresch | 140/105 |
| 3,907,008 | 9/1975 | Bates et al. | 29/566.3 |
| 3,945,100 | 3/1976 | Whiting et al. | 140/105 X |
| 3,971,193 | 7/1976 | Tardiff et al. | 53/198 R |
| 4,003,413 | 1/1977 | Hanson et al. | 140/105 X |
| 4,072,177 | 2/1978 | Daebler | 140/105 |
| 4,077,439 | 3/1978 | Hamuro et al. | 140/1 |

FOREIGN PATENT DOCUMENTS 4227559 12/1967 Japan ...................................... 140/105

Primary Examiner—Horace M. Culver
Attorney, Agent, or Firm—Blum, Moscovitz, Friedman & Kaplan

[57] ABSTRACT

An apparatus re-forms the axial lead of an axial-lead type electronic component into the shape of a U and affixes the electronic components with U-shaped leads to a support tape so as to form a continuous web-carrier carrying a series of electronic components each with a U-shaped lead. The apparatus feeds the electronic component one-by-one to a transfer assembly which transfers the components to a re-forming position and an affixing position in sequence. Means for forming a kink in a lead of each component and for removing excess lead wire are also provided.

15 Claims, 24 Drawing Figures

APPARATUS FOR RE-FORMING AN AXIAL LEAD OF AN ELECTRONIC COMPONENT INTO U-SHAPE AND AFFIXING SAID COMPONENT TO ELONGATED SUPPORT TAPE

BACKGROUND OF THE INVENTION

With the increase in competition in the electronics industry it has become evident that it is highly desirable to provide for automatic insertion of electronic components into printed circuit boards, the objectives being reduction in cost of labor, greater reliability and higher manufacturing rates. Generally, there are two types of automatic inserting machines: one is intended for inserting axial-lead electronic components, while the other is intended for inserting U-shaped-lead electronic components also referred to as radial-lead electronic components. Thus, when it is required to insert a U-shaped-lead electronic component onto a printed circuit board making use of an automatic inserting machine designed for axial-lead electronic components, it has been necessary to take troublesome steps of reforming the axial-lead electronic component into a U-shaped-lead component by bending the lead wires of the axial-lead electronic component, securing the component to a web carrier carrying a series of electronic components, and then feeding the web carrier to an inserting machine.

These steps of reforming and taping have hitherto been carried out wholly manually, this decreasing the advantage of the automatic inserting machine, so that there is an increasing demand for fully automated re-forming of the electronic component and taping of same to web-carriers.

The present invention is aimed at providing an apparatus for re-forming an axial lead electronic component into a radial component and then fixing the component with re-formed lead to an elongated support tape, thereby to automatically prepare a web carrier loaded with electronic components having U-shaped leads.

To this end, according to the invention, there is provided an apparatus comprising, in combination, supply means for supplying axial lead electronic components one by one, transfer means for receiving from said supply means each axial lead electronic component and transferring said axial lead electronic component to a re-forming position and then to an affixing position, said transfer means including support means for supporting an elongated support tape, re-forming means for re-forming an axial type lead of said axial lead electronic component into radial-type lead, and affixing means for affixing the reshaped electronic component onto said elongated support tape.

SUMMARY OF THE INVENTION

An apparatus for re-forming an axial lead of an axial-lead-type electronic component into U-shape and affixing said electronic component, now having a lead in U-shape, also referred to as a radial shape, includes a supply chute for supplying one-by-one electronic components having axial leads, a transfer drum for receiving said electronic components from said supply chute, a bending assembly for re-forming an axial lead of each electronic component into U-shape and an affixing assembly for affixing the electronic components, each having a lead in the shape of a U to a web-like carrier by means of adhesive tape.

In a second embodiment, a drum takes the electronic components from the supply chute to the transfer drum.

In both embodiments, means may be provided for forming a kink in a lead of each electronic component and for trimming excess wire from said leads.

Individual, sequential feed of the electronic components may be accomplished through the use of pairs of support pins associated with the supply chute, said support pins moving inwardly and outwardly alternatingly for supporting and releasing individual electronic components. As another means of providing individual, sequential feed, a shutter operated by a solenoid may be positioned against the lower end of the supply chute.

An object of the present invention is an apparatus for converting an axial-lead electronic component into an electronic component having a U-shaped lead.

Another object of the present invention is an apparatus for reshaping an axial lead into a U-shaped lead.

A further object of the present invention is an apparatus for fastening electronic components having a U-shaped lead to a web-carrier tape.

An important object of the present invention is an apparatus for feeding axial-lead electronic components to a device for re-forming axial leads to U-shaped, i.e., radial leads.

A significant object of the present invention is an apparatus for forming a kink in an axial lead of an electronic component.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
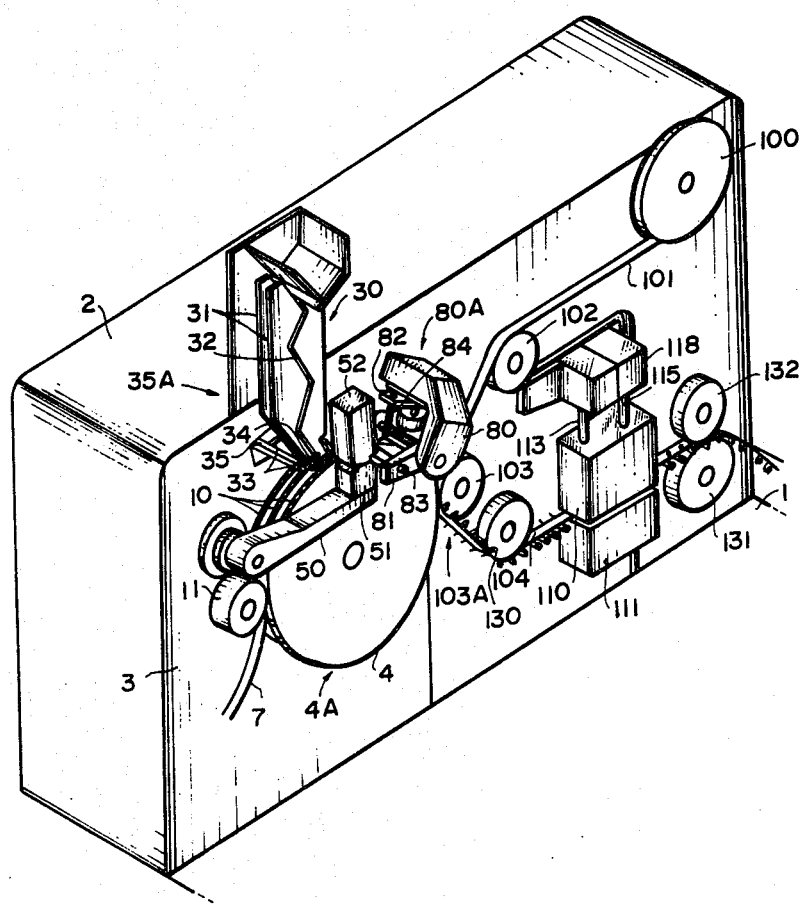
FIG. 1 is a perspective view of an embodiment of the present invention.

Referring first to FIG. 1, the apparatus in accordance with the invention has a supply assembly 35A adapted for supplying axial-lead electronic components one-by-one, a transfer assembly 4A for receiving said axial-lead electronic components individually supplied from said feed assembly and for transferring said axial-lead electronic components to a re-forming position and then to a fixing position, a re-forming assembly 80A adapted for re-forming the axial type leads of said axial lead electronic components into radial type leads, and a fixing assembly 103A adapted for fixing said electronic components with reshaped leads onto an elongated support tape.

Referring to FIGS. 1 to 5, an apparatus body 2 is shown mounted on a base 1. The apparatus body 2 has a front panel 3 on which is provided an index drum 4 as a transfer assembly. In the embodiment shown, the index drum 4 is shown as rotatable in clockwise direction. As will be seen from FIGS. 7 through 10 first annular channel 6 for receiving each electronic component 5 as well as second annular channel 8 for receiving elongated support tape 7 to which the electronic components are to be fixed, are formed on the periphery of the index drum 4. Also, the index drum 4 has a continuous ridge along its periphery. The continuous ridge has, as shown in FIG. 6, a plurality of V-shaped grooves 10 formed thereon for receiving the lead wires 9 of the axial-lead electronic components. These V-shaped grooves 10 are formed at regularly alternating longer and shorter intervals A and B. The front panel 3 (FIG. 2) also carries a rotatable tape feed roller 11 pressed against the periphery of the index drum 4 for rotation therewith.

Figure 2:
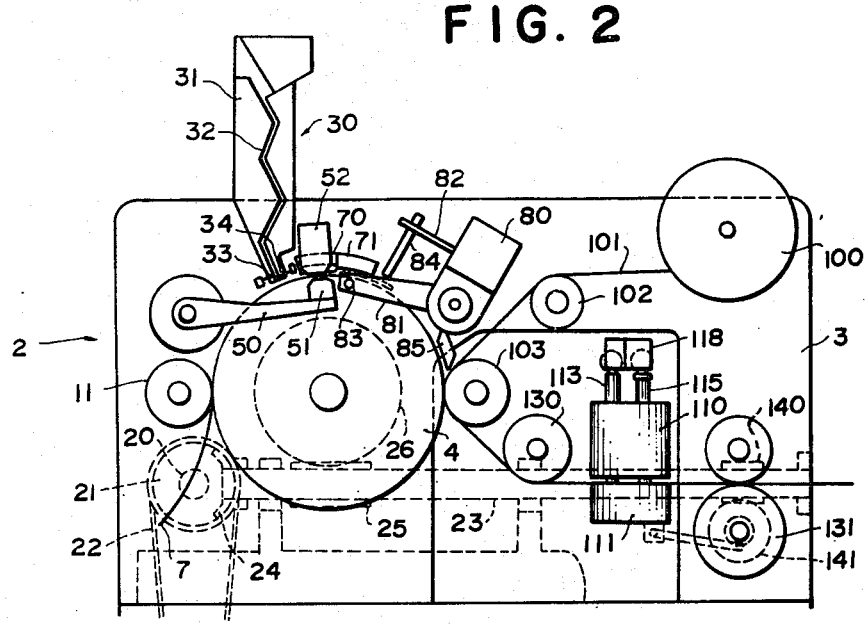
FIGS. 2 to 5 are front elevational views showing portions of the interior mechanism.

The index drum 4 may be driven by a driving mechanism such as is shown in FIG. 2. A cam shaft 20 within the apparatus body 2 extends perpendicularly to the front panel 3. The cam shaft 20 fixedly carries a V-grooved pulley 21 around which goes a V-belt 22 to transmit a torque from an electric motor (not shown) to the cam shaft 20. Drive shaft 23 extends behind and parallel to front panel 3. The drive shaft 23 is driven by cam shaft 20 through a spiral miter gear 24 provided at one end thereof. The drive shaft 23 carries a worm 25 which engages a worm gear 26, worm gear 26 being fixed coaxially with index drum 4. Thus, the index drum 4 can be rotated at a constant speed in clockwise direction.

Fixed to the front panel 3 above the index drum 4 is a chute 30 for accommodating a plurality of electronic components 5. The chute 30 consists of a pair of opposing chute plates 31, defining a zig-zag-shaped slit 32 having a width such as to allow the lead wire 9 of the axial-lead electronic component to pass therethrough. As will be seen from FIGS. 6 and 7, supply-control arms 35 extend from within the apparatus body 2. The supply-control arms carry upper and lower supply pins 33 and 34 which extend along both the front and back surfaces of the lower end portion of the chute 30.

These supply pins 33 and 34 move, in accordance with the movement of the arms 35, alternately in the direction of arrows C or D, so as to release the lead wires 9 of the axial lead electronic components 5, thereby to drop the latter one-by-one onto the index drum 4. Thus, the chute 30 and the supply pins 33 and 34 in combination constitute supply assembly 35A for supplying the electronic components to drum 4.

Figure 3:
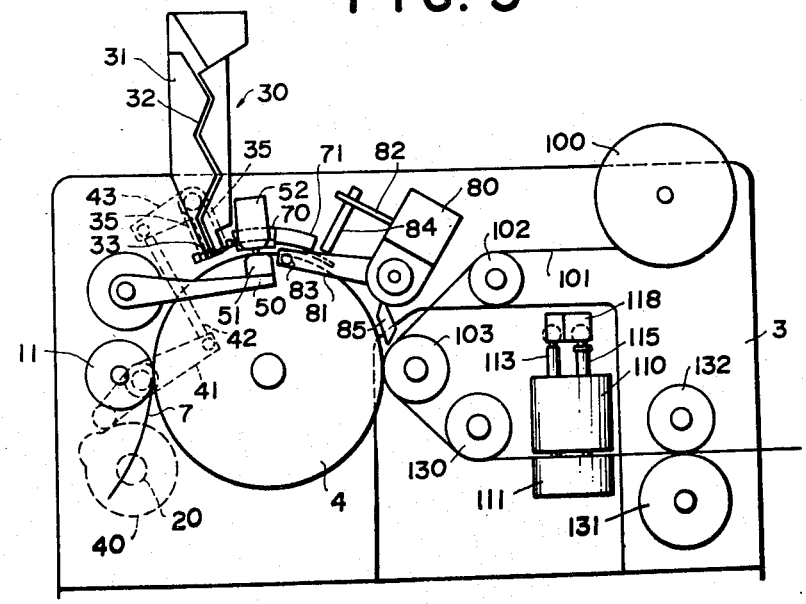

Referring now to FIG. 3 showing a driving mechanism for the supply-control arms 35 and supply pins 33, 34, a supply cam 40 is ixed to the cam shaft 20, and is engaged by one end of a pivotable supply cam lever 41. Supply lever 43 is connected through connecting rod 42 to the other end of the supply cam lever 41. The aforementioned supply-control arms 35 are adapted to be moved interlocking the supply lever 43, so as to alternatively move the upper and the lower supply pins 33 and 34 in the direction of arrow C or D of FIG. 6.

Front panel 3 rotatably carries a kink arm 50 to the end of which fixed in a kink male mold 51. Kink female mold 52 is fixed to the front panel 3, so as to oppose the kink male mold 51. These kink molds in combination constitute a kink assembly for crimping the lead wires 9 of the axial lead electronic components 5 and forming kinks 9a as shown in FIGS. 6 and 8.

Figure 4:
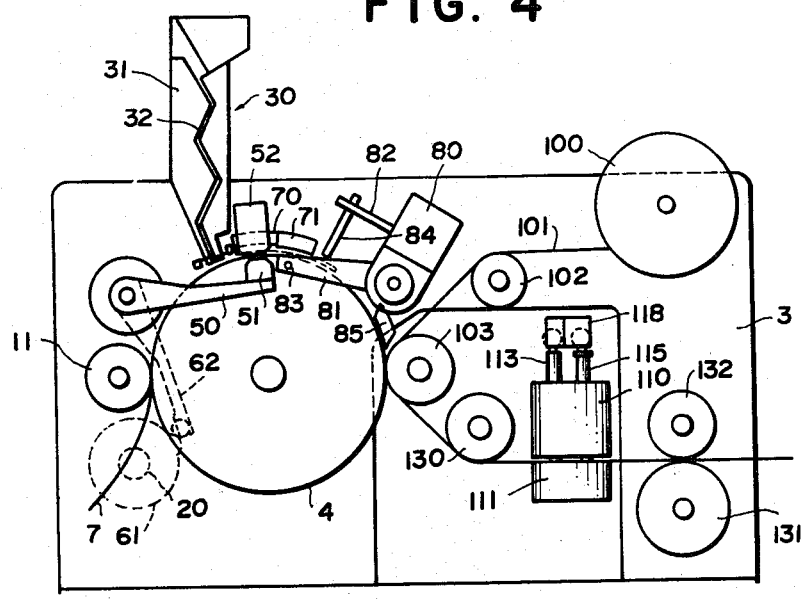

FIG. 4 shows a drive mechanism for the kink arm 50 in which kink cam 61 is fixed to the cam shaft 20 and kink cam lever 62 is mounted for rotation coaxially with kink arm 50, kink cam lever 62 having one end engageable with kink cam 61.

This mechanism makes it possible to drive the kink arm 50 in accordance with the rotation of the cam shaft 20, so that kink male mold 51 performs a cyclic up and downward movement.

Figure 8:
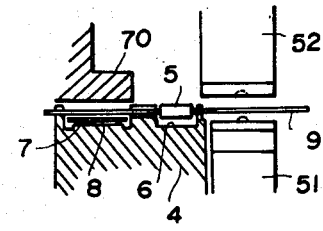
FIG. 8 is a sectional view taken along the line 8—8 of FIG. 6.
Figure 9:
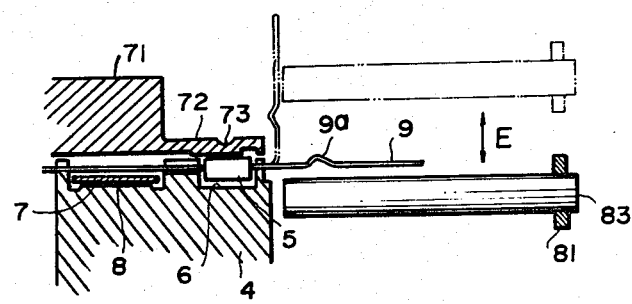
FIG. 9 is a sectional view taken along the line 9—9 of FIG. 6.

As will be seen from FIGS. 6 and 8, a tape guide 70 is fixed to the front panel 3 between said front panel and said kink male mold 51, so as to retain support tape 7 within tape channel 8 on index drum 4. A re-forming guide 71 for re-forming the lead wires 9 is fixed to front panel 3 and located adjacent to the tape guide 70. The re-forming guide 71 has, as shown in FIG. 9, a thin-walled lead guide 72 which extends along the periphery of index drum 4. A U-shaped groove 73 for receiving the kink 9A of the lead wire 9 is formed in the upper surface of lead guide 72.

Figure 10:
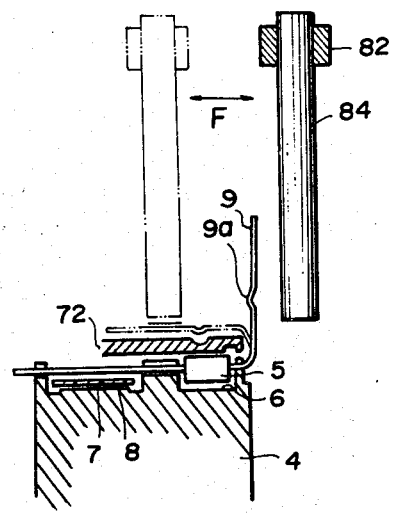
FIG. 10 is a sectional view taken along the line 10—10 of FIG. 6.

Re-forming bracket 80 (FIGS. 5 and 6) of re-forming assembly 80A is fixed to front panel 3. Bending arm 81 and re-forming arm 82 are fixed to bracket 80 rotatably. As shown in FIGS. 9 and 10, bending pin 83 and a re-forming pin 84 are secured to the ends of bending arm 81 and re-forming arm 82, respectively. These pins 83 and 84 are made of a synthetic resin or other relatively soft material so as not to damage the lead wires 9.

The bending arm 81 is moveable in up and down direction as shown by arrow E in FIGS. 6 and 9, while the re-forming arm 82 is moveable in back and forth direction with respect to the front panel 3, as denoted by arrow F in FIG. 10. The bending pin 83 and the re-forming pin 84 move up and down and back and forth, respectively, in accordance with the rotation of the arms 81 and 82, so as to re-form the axial lead wires 9 into U, i.e., radial form.

As shown in FIG. 6 set guide 85 is fixed along the periphery of the index drum 4. The set guide 85 is adapted to introduce the re-formed lead wires 9 into the as yet unoccupied V-shaped grooves 10 of index drum 4.

Figure 5:
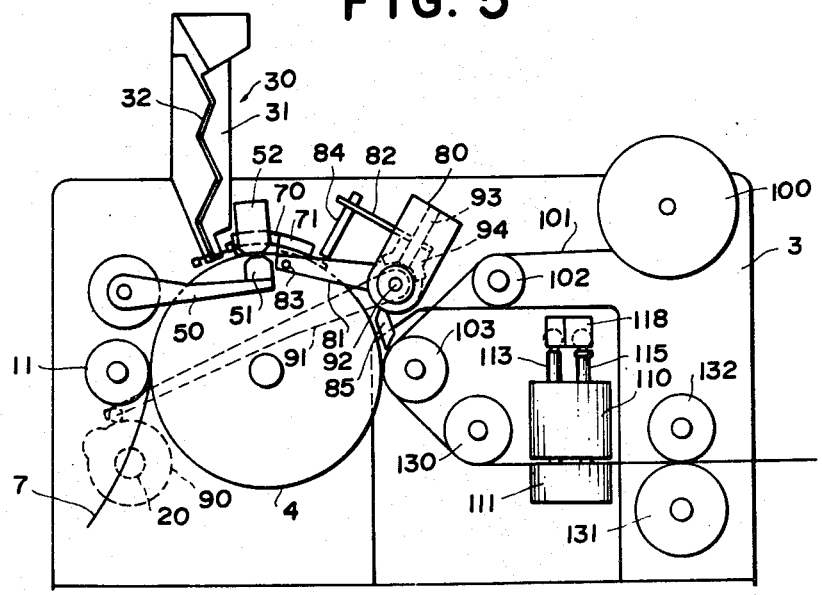
Figure 6:
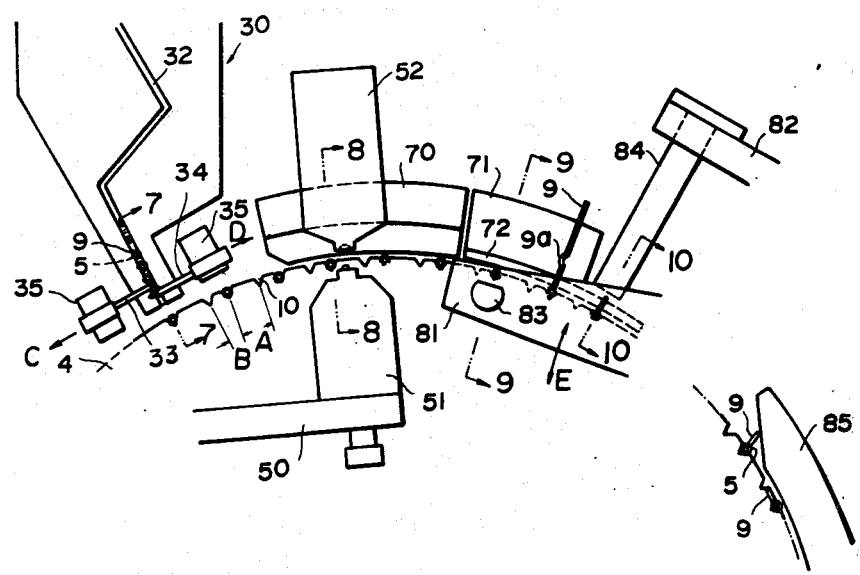
FIG. 6 is an enlarged front elevational view of an essential part.

FIG. 5 shows a driving mechanism for the bending pin 83 and the re-forming pin 84. Re-forming cam 90 is fixed to cam shaft 20 and engages one end of re-forming cam lever 91 which is fixed to bending shaft 92 rotatably supported by the re-forming bracket 80. The aforementioned bending arm 81 is also fixed to this bending shaft 92.

Further, re-forming bracket 80 holds rotatably re-forming shaft 93 which extends at right angles to bending shaft 92. Re-forming shaft 93 is rotated through a spiral miter gear 94 provided at one end thereof, by the aforementioned bending shaft 92. The aforementioned re-forming arm 82 is fixed to the re-forming shaft 93. Therefore, re-forming cam lever 91 is oscillated by the rotation of cam shaft 20 and causes the reciprocation of bending shaft 92. Consequently, the bending arm 81 is moved in the direction of arrow E of FIG. 9. At the same time, since re-forming shaft 93 makes a reciprocatory rotary motion in accordance with the reciprocatory rotary motion of bending shaft 92, re-forming arm 82 moves in the direction of arrow F of FIG. 10.

A spool 100 holds and feeds adhesive tape to affixing assembly 103A and is rotatably supported on front panel 3. The adhesive tape 101 from the spool 100 is guided to the peripheral surface of the index drum 4, through a guide roller 102 and an adhesive roller 103 pressed against the peripheral surface of the index drum 4, and is then adhered to the support tape 7 received in the tape-receiving groove 8 so as to form a web carrier 104 carrying a series of electronic components 5 with re-formed leads.

The front panel 3 is, as occasion demands, provided with a cutting and boring mechanism. More specifically, upper and lower slide blocks 110 and 111 are provided for left and rightward sliding movement as shown by arrow G of FIG. 11, in synchronization with the running speed of the tape.

A cutter rod 113 having at its lower end an upper cutting edge 112 is slidably fitted to the upper slide block 110 for free up and downward sliding movement, as well as a boring rod 115 having at its lower end a boring punch 114. Also, a lower cutting edge 116 for cooperating with the boring punch 114 is fixed to the lower slide block 111.

Above the cutter rod 113 and the boring rod 115, a cam case 118 is fixed to the front panel 3, for supporting cutter cam 119 and boring cam 120. The aforementioned cutter rod 113 and the boring rod 115 are biased upwardly, by means of springs which are not shown, into engagement with the cam contour of the cams 119 and 120. Upper cutting edge 112 and boring punch 114 are periodically lowered by cams 119 and 120 for cutting excess lead wire 9 protruding from support tape 7 of web carrier 104 and for boring in the support tape 7 and the adhesive tape 101 adhered to the latter. These cutting and boring operations are performed during that movement of the slide blocks 110 and 111 which is made in synchronization with the movement of the tape, i.e., at the same speed and in the same direction with the tape.

This synchronous motion can be obtained by means of a driving mechanism for the cutting and boring mechanism, which may be a known mechanism such as a cam or crank mechanism. FIG. 2 exemplarily shows such a driving mechanism consisting of drive shaft 23 and a crank. Also, the driving mechanism for the cams 119 and 120 may be any known mechanism, so that no further description will be needed.

The front panel 3 further carries a guide roller 130 for guiding the web carrier 104 into the gap formed between the upper and the lower slide blocks 110 and 111, and a delivery roller 131 for taking out the web carrier from the slide blocks. The delivery roller 131 presses against idler roller 132.

FIG. 2 shows an example of a driving mechanism for the delivery roller 131. More specifically, a worm 140 for the delivery roller 131 is fixed to the drive shaft 23, and is adapted to engage a worm gear 141 fixed to the delivery roller coaxially with the latter. Consequently, the delivery roller 131 is driven at the same peripheral speed with the aforementioned index drum 4.

Figure 7:
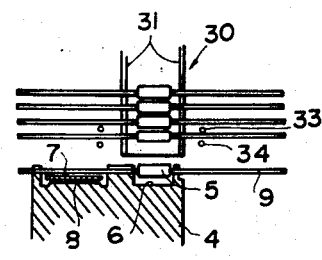
FIG. 7 is a sectional view taken along the line 7—7 of FIG. 6.

In the above described arrangement of mechanisms, the axial-lead electronic components 5 before the re-forming are stacked one on another in the chute 30, as shown in FIGS. 6 and 7. As the electric motor (not shown) is energized, cam shaft 20 and drive shaft 34 rotate as shown in FIGS. 2 through 5, so that index drum 4 rotates clockwise. At the same time, the lower supply pins 34 are retracted, disengaging the lead wire 9 of the lowermost electronic component 5, so that said lowermost electronic component which is held between the lower and the upper supply pins 34 and 33 is allowed to fall onto the component-receiving groove 6 formed in the periphery of index drum 4. In this state, the lead wires 9 of the electronic component are conveniently received by the V-shaped grooves 10 formed in the peripheral ridge of the index drum. The lead wires 9 are introduced only into alternate grooves 10, so that an occupied groove 10 is followed by a vacant groove 10 with the shorter interval B, as viewed in the direction of rotation of the index drum 4, as will be seen from FIG. 6.

After the release of each electronic component 5, the lower supply pins 34 are returned to the projecting position. Subsequently, the upper supply pins 33 are retracted to allow the next electronic component to fall onto the lower support pins 34. The upper supply pins 33 are returned to the projecting position, after releasing the electronic component 5. It will be seen that the upper and the lower supply pins 33 and 34 cooperate with each other to supply the electronic components 5 one-by-one to the index drum 4. The electronic components 5 on the index drum 4 each have one lead wire positioned on the support tape 7, as can be seen from FIG. 12A.

The electronic components on index drum 4 are first transferred to the position of kink molds 51 and 52 by rotation of the index drum 4. As shown in FIG. 8, the kink male mold 51 is raised when lead wire 9 is positioned within the gap between said kink molds and drives the lead wire 9 into the kink female mold 52, thereby forming kink 9a in lead wire 9.

Figure 12:
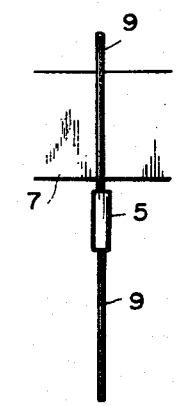
FIGS. 12A to 12F are schematic illustrations of the operation of the embodiment as shown in FIGS. 1 through 11.
Figure 12:
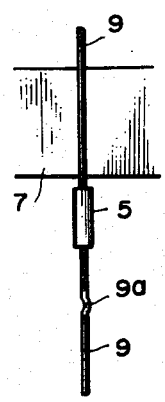
Figure 12:
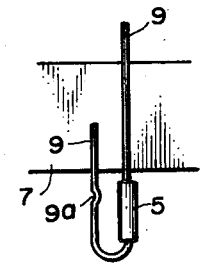
Figure 12:
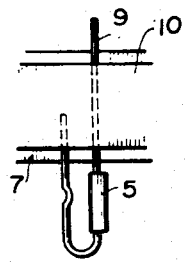
Figure 12:
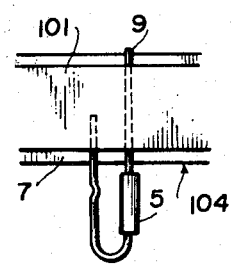
Figure 12:
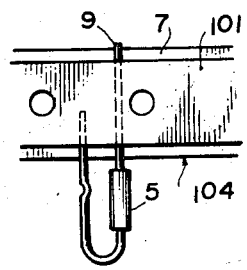

Electronic component 5 is then transferred by movement of drum 4 to the position of bending pin 83. As will be seen from FIG. 6 and FIG. 9, bending pin 83 is moved upward to the position of the two-dots-and-dash line in FIG. 9, in accordance with the rotation of the bending arm 81, at an instant when the lead wire 9 is positioned just above the bending pin 83. Consequently, the lead wire 9 is bent to have an L-shaped form as shown by two-dots-and-dash line. The component having an L-shaped lead wire 9 is then brought to the position of the re-forming pin 84 and pin 84 is moved toward the front panel 3, as shown by two-dots-anddash line of FIG. 10. Lead wire 9 undergoes a second forming operation in which it is bent along the lead guide 72 of the re-forming guide 71, as shown by two-dots-and-dash line, to become U-shaped. The twice-bent lead wire 9 is then brought into contact with the periphery of the index drum 4 and inserted into the adjacent vacant V-shape groove 10 as it passes the set guide 85. At this stage, as shown in FIG. 12C, both lead wires 9 of the electronic component 5 are positioned on the support tape 7.

The electronic component 5 having passed through the set guide 85 is then fed between the index drum 4 and the adhesion roller 103, as shown in FIGS. 1 through 5. The adhesion roller 103 is supplied with the adhesive tape 101, which adheres to support tape 7 with the lead wires 9 of electronic component 5 interposed therebetween thereby fixing the lead wires to the support tape. This adhesion is successively performed for a series of successive electronic components 5, so as to prepare a web carrier 104 having a series of electronic components fixed thereto.

Figure 11:
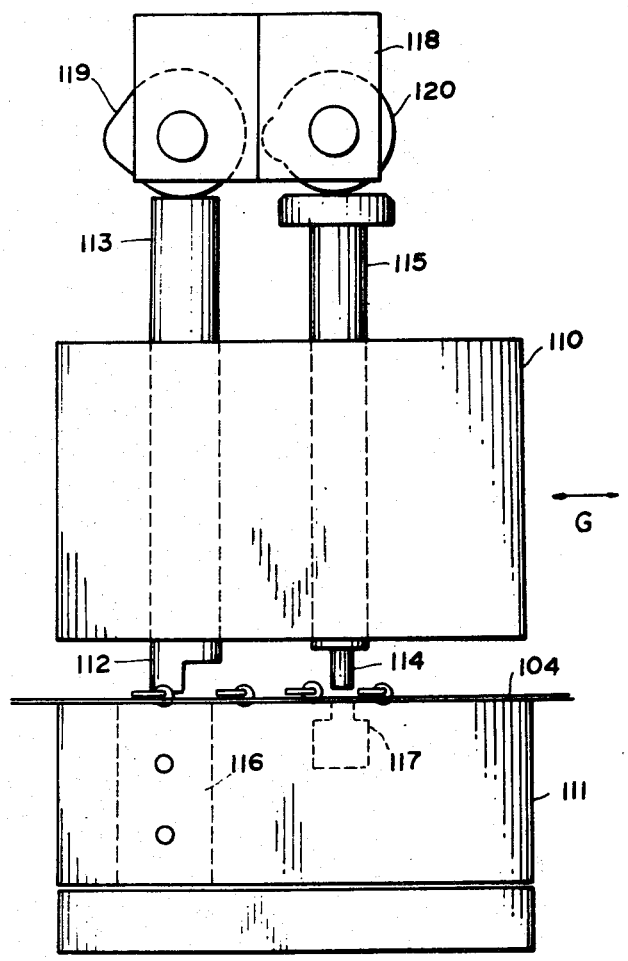
FIG. 11 is an enlarged front elevational view of the cutting and boring assembly of said embodiment of FIG. 1.

The web carrier 104 thus prepared is fed by guide roller 130 (FIG. 5) to the gap between the upper and the lower slide blocks 110 and 111 as shown in FIG. 11, for further processing to facilitate the insertion of the web carrier 104 into the automatic inserting machine, as necessitated. As aforementioned, the upper and lower slide blocks 110 and 111 are moved in synchronization with the movement of the web carrier 104, and upper cutting edge 112 is lowered during this movement to remove the excess lead wire 9 from the support tape. Consequently, the web carrier 104 comes to have a structure as shown in FIG. 12E. At the same time, the boring punch 114 is lowered to perforate the tape at a predetermined pitch, as shown in FIG. 12F. The web carrier thus processed for an easy fitting to the automatic inserting machine is then brought out of the apparatus, by means of the delivery rollers 131 and 132.

It will be seen from the foregoing description that the re-forming of the lead wires 9 of the electronic components 5 into U-shape, as well as the taping of the re-formed electronic components, is performed fully automatically, once the chute is loaded with the electronic components, greatly enhancing the working efficiency and providing a saving in manual labor.

Figure 13:
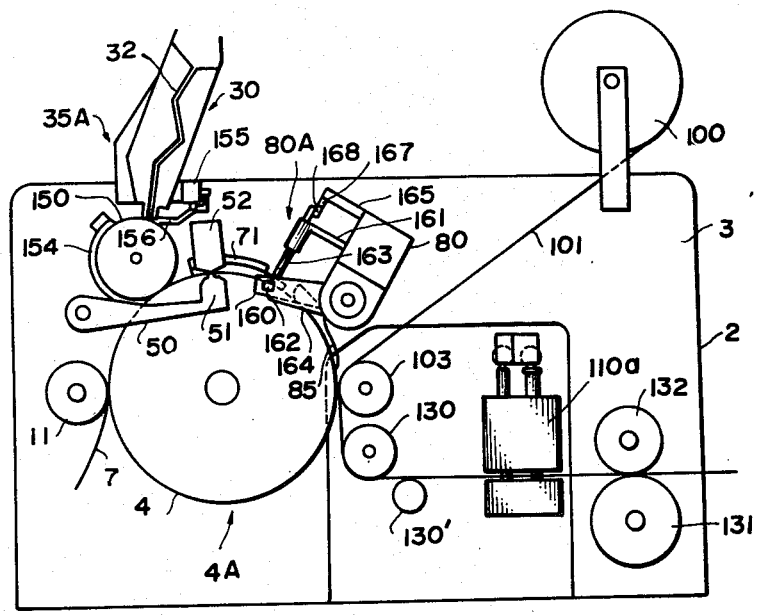
FIG. 13 is a front elevational view of another embodiment of the invention.
Figure 14:
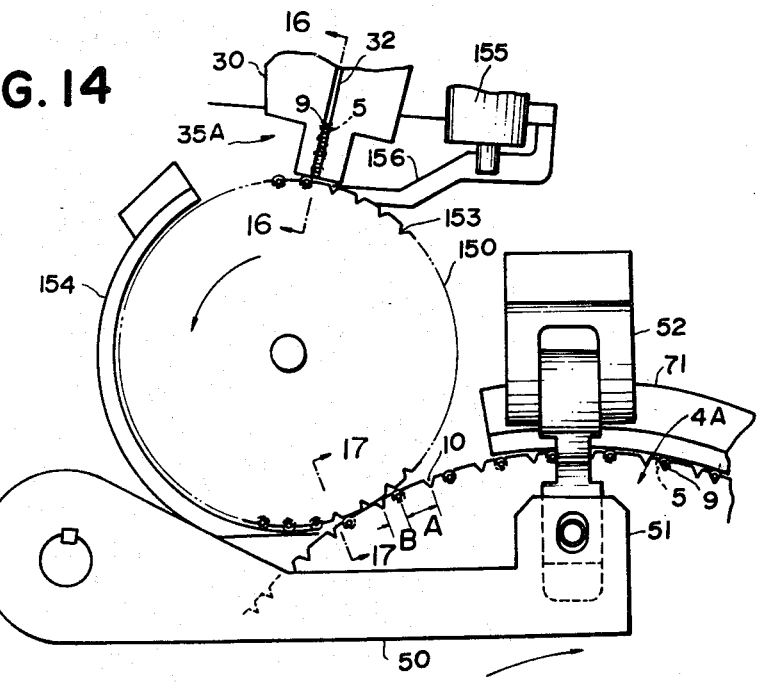
FIG. 14 is an enlarged front elevational view of supplying means incorporated in another embodiment.

Another embodiment of the invention is shown in FIGS. 13 through 19. In this embodiment, the supply assembly 35A has, as shown in FIGS. 13 and 14, a chute 30 secured to the upper portion of the front panel 3 and a supply drum 150 acting between index drum 4 and chute 30. As is the case in the foregoing embodiment, the electronic components 5 are delivered onto the supply drum 150 through the zig-zag slit 32 formed in the chute 30.

Figure 16:
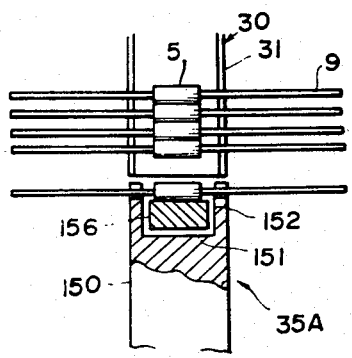
FIG. 16 is a sectional view taken along line 16—16 of FIG. 14.
Figure 17:
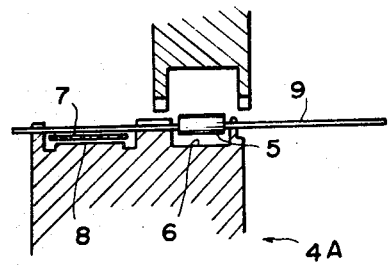
FIG. 17 is a sectional view taken along line 17—17 of FIG. 14.

As shown in FIG. 16, a groove 151 for receiving electronic components is formed in the periphery of supply drum 150. Also, equi-spaced V-shaped grooves 153 for receiving lead wires 9 of the electronic components 5 are formed in both edges of the periphery of drum 150.

A guide 154 (FIG. 13) is provided along the peripheral surface of supply drum 150, for holding the electronic components to the periphery of drum 150.

Shutter solenoid 155 is disposed in the vicinity of the lower end of chute 30 for actuating a shutter 156 which is adapted to stop the supply of the electronic components 5. During the normal supply of electronic components 5, the end of shutter 156 is positioned as shown in FIG. 16, is raised to the lower end of chute 30 when it is desired to stop the supply of electronic components from supply drum 150.

Index drum 4A (FIG. 17) rotatably supported by the front panel 3, has in its peripheral surface a first annular channel 6 for holding the axial lead-electronic components to be received and a second annular channel 8 for receiving the web-like support tape 7, as is the case with the foregoing embodiment. Also, V-shaped grooves 10 for receiving the lead wires 9 of the axial lead-electronic components 5 are formed at a constant pitch in the peripheral ridges of the index drum 4, as will be seen from FIGS. 14 and 15.

The supply drum 150 and index drum 4A are adapted to be rotated intermittently, by known driving mechanism, in such a synchronized manner that each groove 10 formed in the peripheral ridge of the index drum 4A is in alignment with a V-shaped groove 153 formed in supply drum 150, when both drums are intermittently rotated, so that the electronic component 5 in a V-shaped groove 153 of supply drum 150 may be transferred to a corresponding V-shaped groove 10 in index drum 4A.

A bending and re-forming guide 71 extends along the peripheral surface of index drum 4A, and a kink mechanism comprising a kink arm 50 and a kink male and female molds 51 and 52 are provided prior to guide 71 along the index drum 4A.

Figure 15:
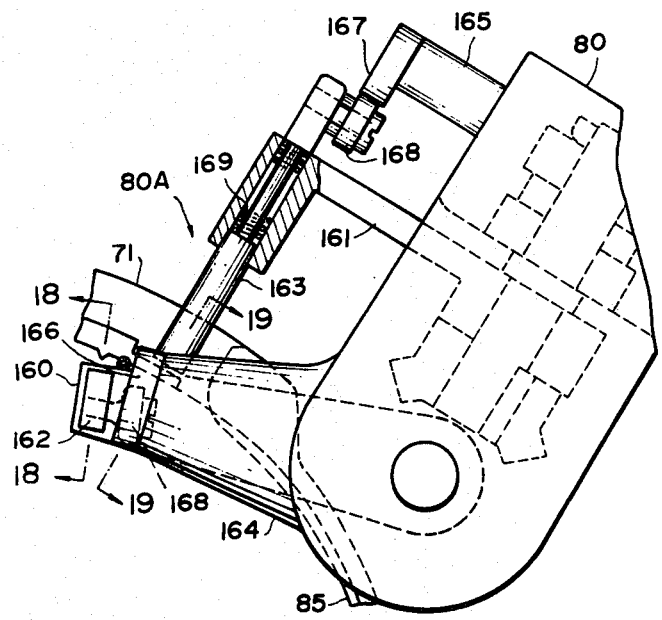
FIG. 15 is a front elevational view of an essential part of the forming mechanism.

The re-forming assembly 80A of this embodiment is constructed as follows. Referring to FIGS. 13 and 15, a re-forming bracket 80 is affixed to front panel 3. A bending arm 160 and a re-forming arm 161 are rotatably secured to re-forming bracket 80. The bending arm 160 and the re-forming arm 161 slidably support at their ends a bending pin 162 and a re-forming pin 163, respectively. Re-forming bracket 80 also carries a bending cam support 164 and a re-forming cam support 165. Bending cam 166 and re-forming cam 167 are secured to the ends of these supports 164 and 165. The cams 166 and 167 are adapted to engage rollers 168 pivoted to bending arm 160 and the re-forming arm 161, so as to bias bending pin 162 and re-forming pin 163 outwardly. The manner in which the re-forming pins carry out the re-forming operation is described below.

The re-forming pin 163 is normally biased inwardly by a compression spring 169. Similarly, the bending pin 162 is biased inwardly, by means of a spring.

Figure 18:
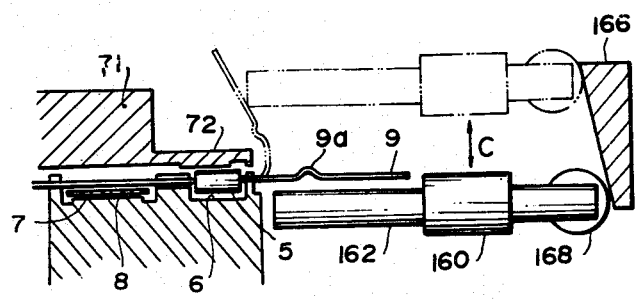
FIG. 18 is a sectional view taken along line 18—18 of FIG. 15.
Figure 19:
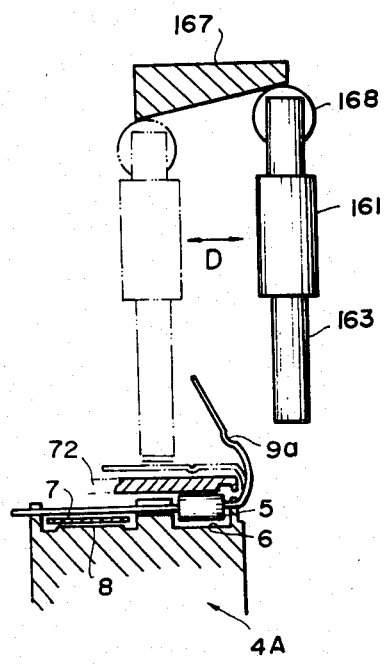
FIG. 19 is a sectional view taken along line 19—19 of FIG. 15.

As shown in FIG. 18, bending pin 162 moves up and down in the direction of arrow C, at the front surface of the index drum 4A, in accordance with the rotation of the bending arm 160, and performs an axial motion during the upward movement actuated by the bending cam 166. Then, as shown in FIG. 19, re-forming pin 163 is caused to move back and forth in the direction of arrow D along the lead guide 72 provided in the re-forming guide 71, by the rotation of the re-forming arm 161, and is forced to project outwardly by the re-forming cam 167, during its forward movement.

The front panel carries (FIG. 13) adhesive tape roll 100, adhesion roller 103, guide roller 130, cutting and boring mechanisms 110a, delivery rollers 131 and 132, and tape feed roller 11 for affixing re-formed electronic components to a support tape.

In operation, axial-lead electronic components 5 to be re-formed are stacked one on another in the chute 30. As the index drum 4A and the supply drum 150 are intermittently driven in synchronization with each other, in clockwise and counterclockwise directions respectively, the lead wires 9 of the successive electronic components 5 are received by the V-shaped groove 153 of the supply drum 150, for each circumferential displacement of the supply drum 150 by one pitch of grooves 153, when the shutter 156 is open. Consequently, the electronic components 5 are successively supplied, one by one, with their lead wires received by the grooves 153, to the index drum 4A.

Since the rotations of the supply drum 150 and the index drum 4A are in synchronization with each other, the grooves 153 and 10 are aligned and the electronic components 5 are transferred from supply drum 150 to index drum 4A, one-by-one, at every rotation by one pitch of the grooves, and each component is thus received by channel 6 on the periphery of index drum 4A. At the same time, the lead wires 9 of the electronic components 5 are set in the V-shaped grooves 10 on the periphery of the index drum 4A. This setting of the lead wires is made for each two grooves 10, i.e., for alternating one of the grooves 10, in such a manner that an occupied groove is followed by an empty groove with the shorter interval B therebetween, as viewed in the direction of the rotation of the index drum 4A.

Thus, the electronic components 5 on the index drum 4A at this state each have one lead wire located on the support tape 7. The electronic components 5 carried by index drum 4A are then transferred, as the index drum 4A rotates, to the position of kink molds 51 and 52, so as to be provided with kinks 9a in one of their lead wires 9, in the same manner as in the foregoing embodiment.

Subsequently as index drum 4A rotates, the electronic components 5 are then transferred to the position of bending pin 162. At the instant when lead wire 9 is brought into position immediately above bending pin 162, bending pin 162 is moved upwardly and projects forwardly as shown by two-dots-and-dash line in FIG. 18, due to a rotation of bending arm 160.

Lead wire 9 is thus bent, as shown by two-dots-and-dash line, through an angle greater than a right angle. As the lead wire thus bent is brought to the position of re-forming pin 163, pin 163 is moved toward front panel 3, as shown by two-dots-and-dash line in FIG. 19, and is projected downwardly, that is, toward the drum 4A. Therefore, the lead wire 9 is bent along lead guide 72 provided in re-forming guide 71, as shown by two-dots-and-dash line, to become a U-shaped lead. The re-formed lead wire 9 is received at its bent end by empty groove 10, as it passes set guide 84 provided along the peripheral surface of index drum 4A, and electronic components 5, each with a lead wire re-formed into U-shape, are positioned on support tape 7, as is the case with the foregoing embodiment.

The re-formed electronic components 5 are then fed, along with support tape 7, between index drum 4A and adhesion roller 103, so that they may be fixed onto support tape 7 by means of adhesive tape 101. The support tape 7, electronic components 5 and the adhesive tape 101 then constitute a web carrier including a series of electronic components.

The web carrier is then transferred as necessitated to the subsequent processing steps of cutting and boring, which are performed by cutting and boring mechanism 110a, so as to be rendered suitable for supply to automatic inserting machinery. The web carrier, now perforated and freed of the excessive length of lead wires, is then taken out of the apparatus by means of delivery rollers 131 and 132.

As will be seen from the foregoing, safe operation of the apparatus is ensured because the supply drum 150 interposed between the chute 30 and the index drum 150 provides a constant supply of the electronic components 5 one-by-one to index drum 4A.

At the same time, the bending and re-forming of the lead wire are rendered smooth and safe, due to the slidable mountings of the bending and the re-forming pins 162 and 163 on respective arms 160 and 161 so as to be projected by the bending cam 166 and the re-forming cam 167, respectively.

The invention is widely applicable to the re-forming and taping of various axial lead electronic components such as resistors, capacitors, diodes and the like.

As has been described, according to the invention, the re-forming of axial lead electronic components into U-shape and preparation of a web carrier holding a series of U-shaped lead electronic components can be performed fully automatically, greatly contributing to improvement in the working efficiency and to saving of manual labor in attaching electronic components to printed circuit boards.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An apparatus for re-forming an axial lead of an axial-lead electronic component into a U-shaped lead and affixing said electronic component to an elongated support tape, each said component having a body and first and second axial leads and each of said axial leads having an inner and an outer end, said apparatus comprising, in combination, supply means for supplying axial-lead electronic components one by one;

transfer means for receiving said axial-lead electronic components from said supply means, for holding said components only by said inner ends of said axial leads and for transferring same to a re-forming position and thence to an affixing position without applying stress to said body, said transfer means including support means for supporting an elongated support tape and having an axis of rotation;

re-forming means at said re-forming position for re-forming said first axial lead of said axial-lead electronic component into a U-shaped lead, said re-forming means including a bending arm rotatably along a front surface of said transfer means, a bending pin slidably supported by said bending arm, a bending cam for operating said bending arm, a re-forming arm movable in the axial direction of said transfer means, a re-forming pin slidably supported by said re-forming arm and a re-forming cam for operating said re-forming arm; and affixing means at said affixing position for affixing said electronic component to said elongated support tape.

2. The apparatus as set forth in claim 1, wherein said supply means includes chute means for storing a plurality of axial-lead electronic components and supply-control means for controlling the supply of each axial-lead electronic component from said chute means to said transfer means.

3. The apparatus as set forth in claim 2, wherein said supply means includes a supply drum for receiving from said chute means each axial-lead electronic component supplied thereby and for supplying same to said transfer means.

4. The apparatus as set forth in claim 1, wherein said transfer means includes a transfer drum having in its periphery a first annular channel for receiving said electronic components, a second annular channel for receiving said elongated support tape, and a plurality of grooves for receiving the lead wires of said components and for holding said components by engagement of said lead wires at said inner ends thereof.

5. The apparatus as set forth in claim 1, further comprising an adhesive-tape drum for supplying adhesive tape to said affixing means.

6. The apparatus as set forth in claim 1, wherein said affixing means includes means for pressing adhesive tape against said elongated support tape with the leads of each electronic component interposed therebetween, said adhesive tape and said elongated support tape cooperating in affixing firmly the lead wires of each electronic component therebetween, each electronic component thus affixed having a U-shaped lead.

7. The apparatus as set forth in claim 2, wherein said supply-control means includes a first pin and a second pin supporting and for feeding one-by-one said electronic components, said first and second pins being constructed to be operable periodically and alternatingly.

8. The apparatus as set forth in claim 2, wherein said supply-control means includes a shutter means and a shutter-solenoid for operating same.

9. The apparatus as set forth in claim 4, wherein said bending pin is movable in the radial direction of said transfer drum and said re-forming pin is movable in the axial direction of said transfer drum along the peripheral surface of said transfer drum.

10. The apparatus as set forth in claim 1, further includes kink means for forming a kink on a lead wire of each electronic component.

11. The apparatus as set forth in claim 10, wherein said kink means is positioned adjacent the periphery of said transfer drum for forming said kink prior to reforming said axial lead to U-shape.

12. The apparatus as set forth in claim 1, further comprising cutting means for removing excess wire from the leads of said electronic components.

13. The apparatus as set forth in claim 1, further comprising boring means for forming indexing openings in said support tape for use in positioning electronic components for automatic insertion in printed circuit boards.

14. The apparatus as set forth in claim 1, wherein said support tape is disposed to one side of said component, said one side being that corresponding to said second axial lead.

15. The apparatus as set forth in claim 1, further comprising set-guide means for rotating said U-shaped lead into position for engagement with said support tape.

* * * * *